(12) United States Patent
Koscielniak

(10) Patent No.: US 6,713,814 B1
(45) Date of Patent: Mar. 30, 2004

(54) DMOS TRANSISTOR STRUCTURE WITH GATE ELECTRODE TRENCH FOR HIGH DENSITY INTEGRATION AND METHOD OF FABRICATING THE STRUCTURE

(75) Inventor: Waclaw C. Koscielniak, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/212,392

(22) Filed: Aug. 5, 2002

(51) Int. Cl.[7] .............................................. H01L 29/76
(52) U.S. Cl. ...................... 257/330; 257/288; 257/296; 257/301; 257/302; 257/303; 257/304; 257/327; 257/328; 257/330; 257/332; 438/197; 438/242; 438/243; 438/259; 438/270; 438/271
(58) Field of Search ................................ 257/288, 296, 257/301, 302, 303, 304, 327, 328, 330, 332; 438/197, 242, 243, 259, 270, 271

(56) References Cited

U.S. PATENT DOCUMENTS

| | | | | |
|---|---|---|---|---|
| 4,859,615 A | * | 8/1989 | Tsukamoto et al. | ............ 437/38 |
| RE33,261 E | * | 7/1990 | Baglee et al. | .............. 357/23.6 |
| 5,976,936 A | * | 11/1999 | Miyajima et al. | ........... 438/268 |
| 6,194,273 B1 | * | 2/2001 | Matsuura et al. | ........... 438/270 |

* cited by examiner

*Primary Examiner*—Tom Thomas
*Assistant Examiner*—Edgardo Ortiz
(74) *Attorney, Agent, or Firm*—Stallman & Pollock LLP

(57) ABSTRACT

A double diffused MOS (DMOS) transistor structure is provided that uses a trench trough suitable for high-density integration with mixed signal analog and digital circuit applications. The DMOS device can be added to any advanced CMOS process using shallow trench isolation by adding additional process steps for trench trough formation, a trench implant and a P-body implant. The trench trough and trench implant provide a novel method of forming a drain extension for a high-voltage DMOS device.

2 Claims, 3 Drawing Sheets

DMOS TRANSISTOR STRUCTURE WITH GATE ELECTRODE TRENCH FOR HIGH DENSITY INTEGRATION AND METHOD OF FABRICATING THE STRUCTURE

TECHNICAL FIELD

The present invention relates to double diffused MOS (DMOS) field effect transistors and, in particular, to a DMOS transistor structure that utilizes a gate electrode trench suitable for high-density integration with mixed signal analog and digital circuit applications, and to a method of fabricating the DMOS transistor structure.

BACKGROUND OF THE INVENTION

DMOS field effect transistors are typically used for power devices that require a high voltage and fast switching. DMOS devices are fabricated utilizing a double diffusion process to form a P-type body region and an N-type high-density source region by implanting ions through a window defined by a polysilicon gate.

In conventional DMOS transistor structures, the surface area occupied by the polysilicon gate electrode limits the DMOS cell density. Thus, it would be desirable to have a DMOS transistor structure with reduced gate electrode surface area.

SUMMARY OF THE INVENTION

The present invention provides a DMOS transistor that uses a gate electrode trench, making the device suitable for high-density integration with mixed signal analog and digital circuit applications. The device can be added to any advanced CMOS process using shallow trench isolation (STI) by including additional process steps for formation of a gate trench trough, a trench implant and a P-body implant. The gate trench trough and trench implant provide a novel method of forming the drain extension of a high-voltage DMOS device.

The features and advantages of the present invention will be more fully appreciated upon consideration of the following detailed description of the invention and the accompanying drawings, which set forth an illustrative embodiment in which the principles of the inventions are utilized.

DETAILED DESCRIPTION OF THE INVENTION

FIGS. 1–5 illustrate a method of fabricating a DMOS transistor structure in accordance with the concepts of the present invention. Those skilled in the art will appreciate that the particular process parameters utilized in fabricating the DMOS transistor structure will vary depending upon the specific desired transistor characteristics and the particular application. Those skilled in the art will also appreciate that the concepts of the invention described herein can be applied to a DMOS transistor having either P or N polarity.

Figure 1:
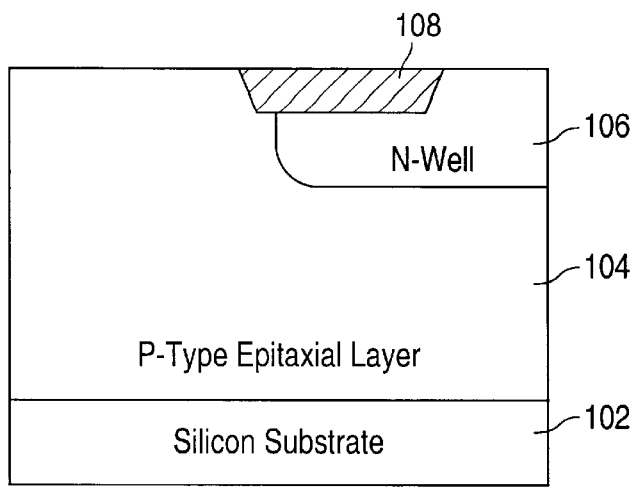
FIGS. 1–5 are cross-sectional drawings illustrating a method of fabricating a DMOS transistor structure in accordance with the present invention.

FIG. 1 shows a P-type epitaxial silicon layer 104 formed on an underlying silicon substrate 102, preferably also P-type silicon. An N-well region 106 is formed in the conventional manner in an upper surface of the P-type epitaxial layer 104. A conventional shallow trench isolation region 108 is formed in the surface of the P-type epitaxial layer to overlap a peripheral edge of the N-well region 106, as illustrated in FIG. 1. The STI isolation region 108 can be used for CMOS isolation as an integral part of the DMOS architecture of the present invention.

Figure 2:
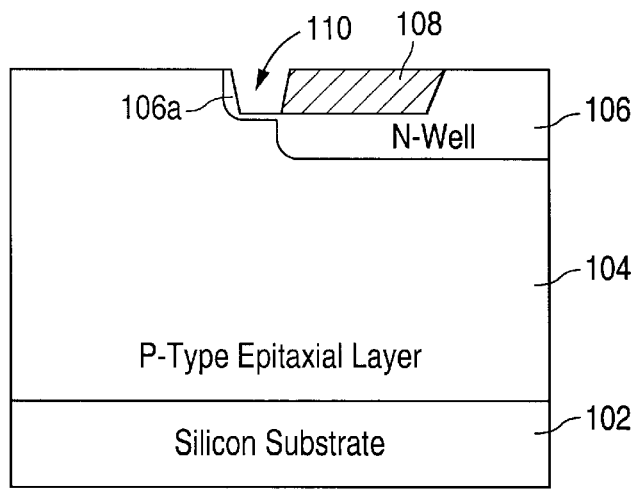

As shown in FIG. 2, in accordance with the concepts of the present invention, a gate electrode trench trough 110 is etched in the upper surface of the P-type epitaxial layer 104 and the N-well region 106 such that one of the sidewalls of the gate trench trough 110 is formed by exposed epitaxial silicon 104, whereas the STI oxide 108 forms the remaining sidewalls of the trench trough 110. It is noted that the etch process for forming the trench trough 110 should not damage the exposed silicon surface since gate oxide is to be grown over the silicon surface. Poor silicon surface quality may adversely effect the integrity of the grown gate oxide.

Next, as further shown in FIG. 2, a trough implant of about 2e12 $1/cm^2$ at 30 keV phosphorous forms an N-type connection region 106a under the trench trough 110 and extending to the N-well region 106; an angled implant is preferred to obtain sufficient depth into the epitaxial silicon sidewall. As stated above, the exact implant conditions will depend upon particular device applications.

Figure 3:
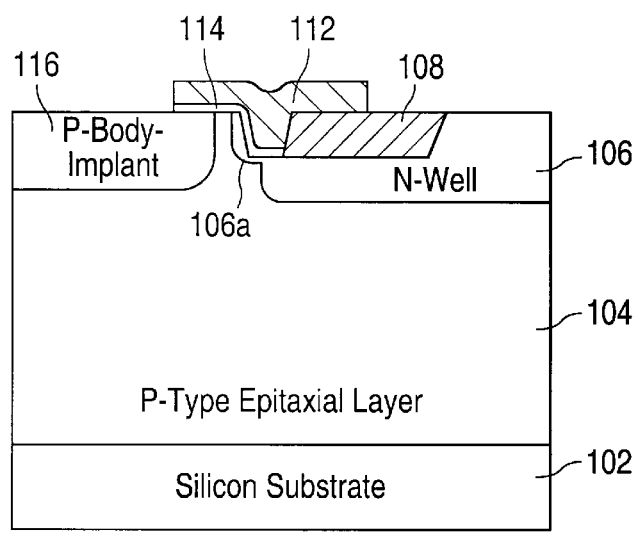

Next, a layer of gate oxide is grown over the surface of the structure resulting from the foregoing steps. This is followed by the deposition of an overlying layer of polysilicon. As shown in FIG. 3, following the gate oxide growth and polysilicon deposition, the structure is etched to define a polysilicon gate electrode 112 with underlying gate oxide 114 that extends over a surface portion of the epitaxial layer 104 as well as to cover the sidewalls and bottom of the trench trough 110. As further shown in FIG. 3, the polysilicon gate electrode 112 fills the trench trough 110.

FIG. 3 also shows the results of utilizing an angled P-body implant on one side of the polysilicon gate 112 to define a P-body implant region 116 that is self-aligned to the edge of the polysilicon gate 112 without direct implant penetration through the gate electrode polysilicon. As illustrated in FIG. 3, the P-body implant region 116 is typically kept away from the trench implant 106a, although, as discussed below, there may be cases where these two implants may touch or overlap as desired. To obtain the best device uniformity, a four way implant should be used for the P-body implant 116. Typical implant conditions would be 4×2.5e12 $1/cm^2$ at 100 keV boron with four wafer rotations of 0°, 90°, 180° and 270°. The choice of the implant energy will be determined by the P-body depth and lateral spread. With the higher energy, the P-body implant 116 may reach the N-type connection 106a. This situation is acceptable for low voltage applications; however, for high voltage applications, the P-body implant 116 and the N-type connection 106a may need to be maintained separate, as illustrated in FIG. 3.

Figure 4:
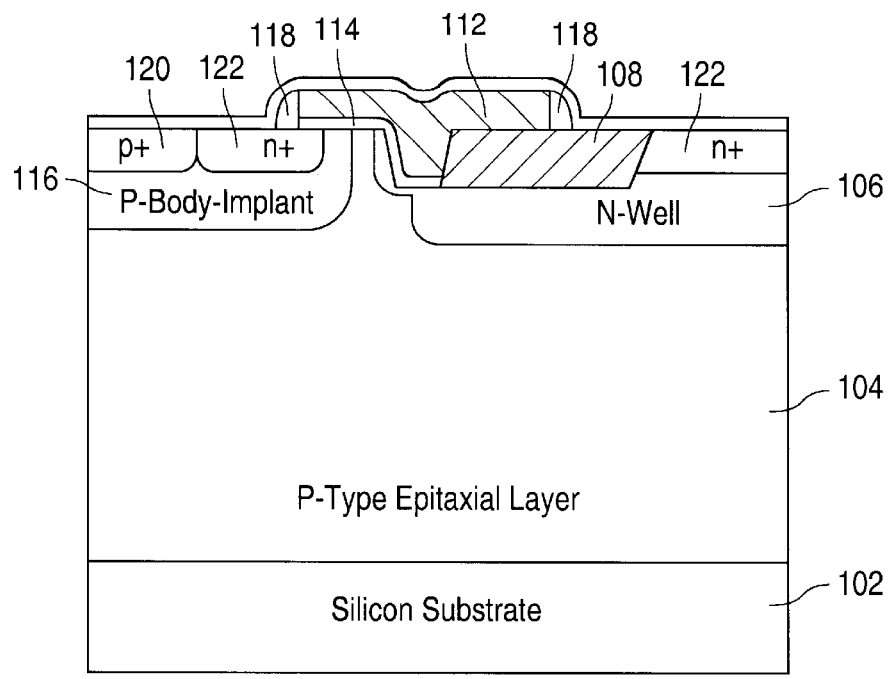

As shown in FIG. 4, after definition of oxide spacers 118 on sidewalls of the polysilicon gate electrode 112 in the conventional manner, P+implants 120 and N+source/drain implants 122 common to the MOS transistors are implanted. The P+implant 120 allows for a low resistance contact to the P-body implant 116 since the implant dose of the P+implant 120 would usually be about three orders of magnitude higher. The N+implant 122 forms the source region of the DMOS transistor and is commonly used in CMOS processes with the implant dose being comparable to that of the P+implant. The N+implant 122 also forms a low resistance part of a drain region of the DMOS transistor.

Figure 5:
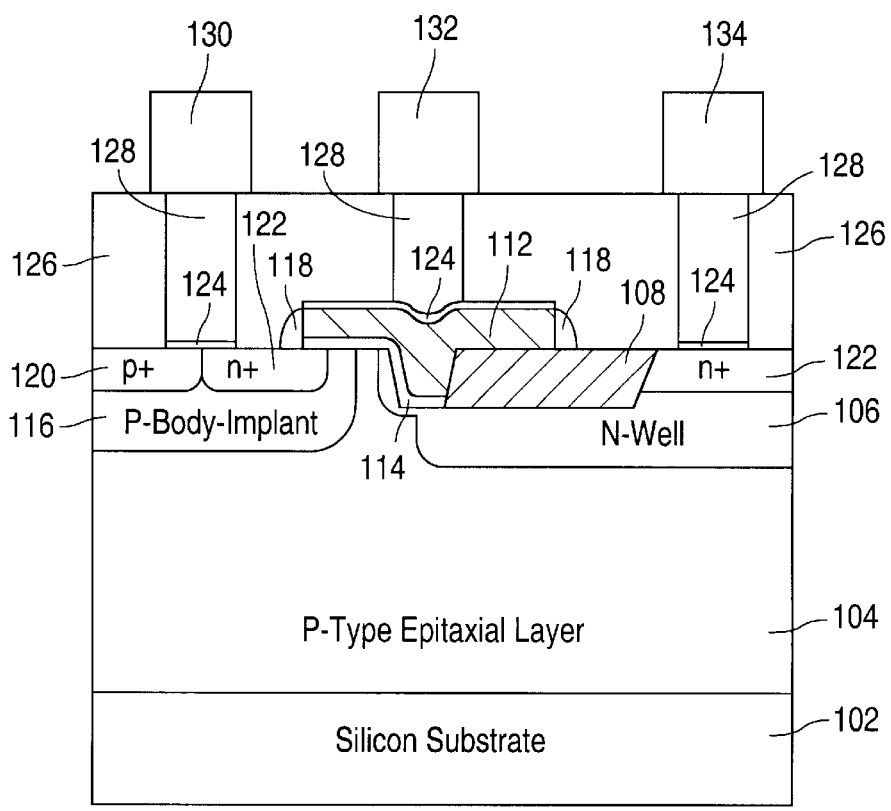

As shown in FIG. 5, the formation of cobalt silicide 124, deposition of dielectric 126 (typically silicon oxide), formation of conductive contact plugs 128 (e.g. tungsten) and formation of first layer metal (e.g. aluminum) are performed in the conventional manner to complete the DMOS device structure of the present invention in the context of a CMOS integrated process. The left metal electrode 130 in FIG. 5 is the source electrode, the middle electrode 132 is the gate electrode, and the right electrode 134 is the drain electrode. The P-body and the source region are contacted simultaneously with the left, source electrode 130.

Figure 6:
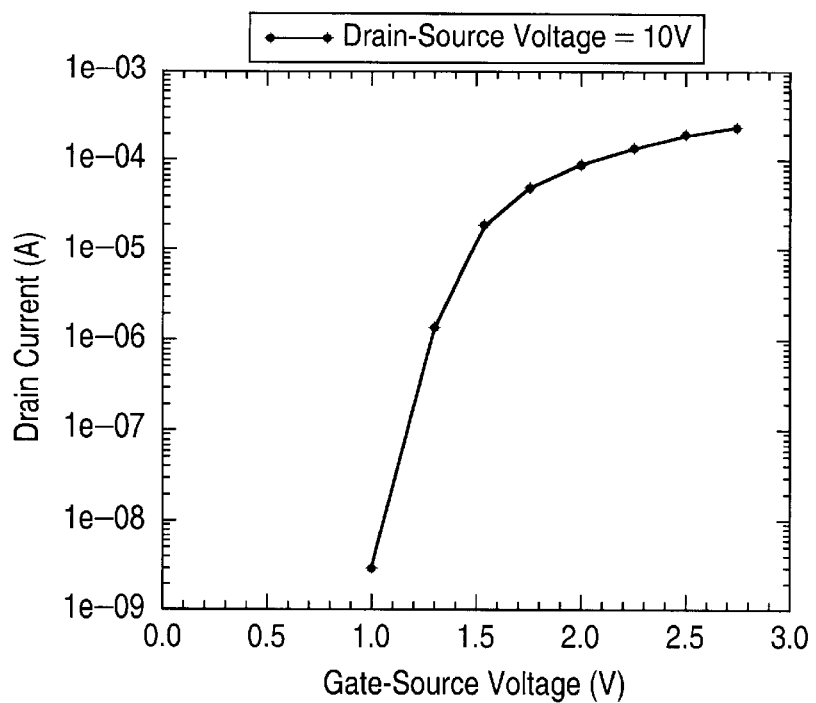
FIG. 6 is a graph illustrating simulated drain current as a function of gate-source voltage for a constant drain-source bias of 10 volts utilizing a DMOS transistor structure in accordance with the present invention.

FIG. 6 displays a simulated drain current of a DMOS device structure in accordance with the present invention as a function of gate-source voltage for a constant drain-source bias of 10V. A target threshold voltage Vt of 1.2V can easily be obtained with this integration approach. Higher drain bias than 10V can be used, but require different implants than those commonly found in CMOS processes. This makes integration possible, but somewhat more complicated.

Figure 7:
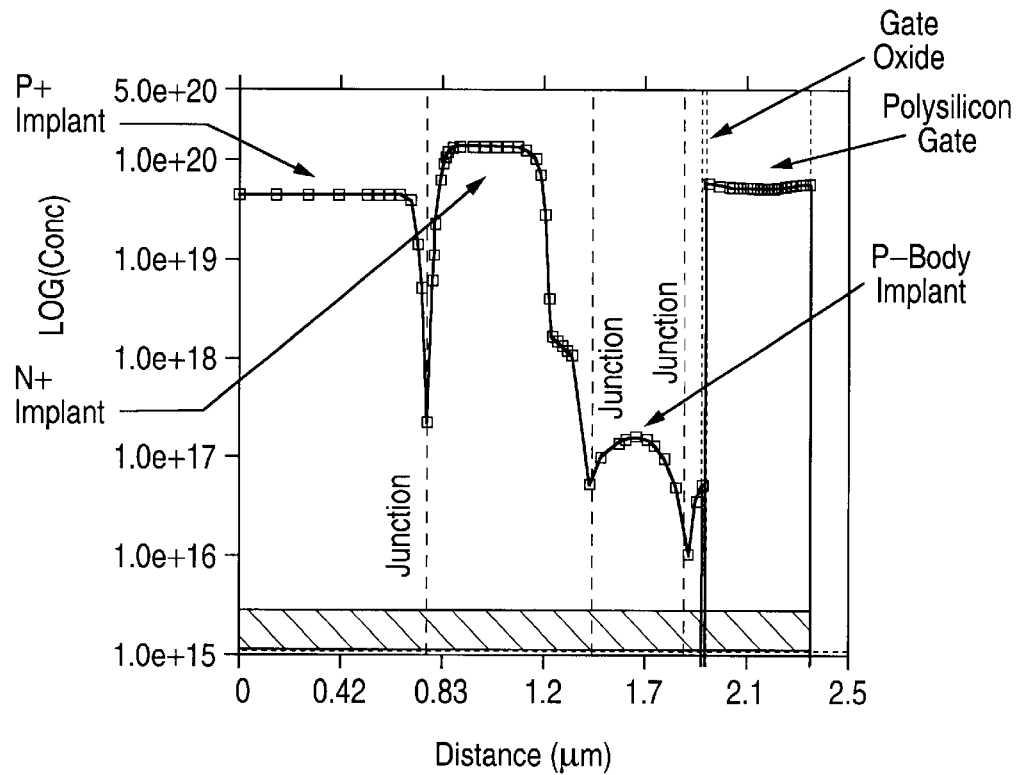
FIG. 7 is a graph illustrating the lateral doping profile of a DMOS transistor structure in accordance with the present invention.

A DMOS transistor lateral doping profile for a device in accordance with the present invention is shown in FIG. 7. This profile illustrates device doping close to the silicon surface that can be obtained with a thermal budget of a typical CMOS process. Doping levels can be adjusted to the required breakdown of the DMOS device.

It should be recognized that a number of variations of the above-described embodiments of the invention would be obvious to one of skill in the art. Accordingly, although specific embodiments and methods of the present invention are shown and described herein, this invention is not to be limited by the specific embodiments. Rather, the scope of the invention is to be defined by the following claims and their equivalents.

What is claimed is:

1. A double diffused MOS (DMOS) transistor structure comprising:

an epitaxial silicon layer having a first conductivity type formed on a silicon substrate;

a well region having a second conductivity type that is opposite the first conductivity type formed in the epitaxial silicon layer;

a dielectric isolation region formed in the epitaxial silicon layer at the periphery of the well region;

a trench trough formed in the epitaxial silicon layer such that one of the walls of the trench trough comprises exposed epitaxial silicon and remaining walls of the trench trough comprise dielectric isolation material;

a connection region having the second conductivity type formed in the epitaxial silicon layer under the trench trough, and extending into contact with the well region, and comprising dopant of the second conductivity type introduced into the epitaxial silicon sidewall of the trench trough;

a conductive gate electrode formed to extend into the trench trough but to be separated from sidewalls of the trench trough by intervening gate dielectric material; and a body implant region having the first conductivity type formed in the epitaxial silicon layer on one side of the conductive gate electrode.

2. A double diffused MOS (DMOS) transistor structure as in claim 1, and wherein the body implant region is spaced-apart from the connection region.

* * * * *